US009828676B2

(12) United States Patent
Harumoto et al.

(10) Patent No.: US 9,828,676 B2
(45) Date of Patent: Nov. 28, 2017

(54) SUBSTRATE PROCESSING APPARATUS AND SUBSTRATE PROCESSING METHOD

(71) Applicant: SCREEN Semiconductor Solutions Co., Ltd., Kyoto (JP)

(72) Inventors: Masahiko Harumoto, Kyoto (JP); Tadashi Miyagi, Kyoto (JP); Yukihiko Inagaki, Kyoto (JP); Koji Kaneyama, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 0 days.

(21) Appl. No.: 15/185,177

(22) Filed: Jun. 17, 2016

(65) Prior Publication Data

US 2016/0289839 A1  Oct. 6, 2016

Related U.S. Application Data

(63) Continuation of application No. 13/943,198, filed on Jul. 16, 2013, now Pat. No. 9,375,748.

(30) Foreign Application Priority Data

Jul. 18, 2012 (JP) ................................ 2012-159917

(51) Int. Cl.
*G03D 5/00* (2006.01)
*C23C 16/56* (2006.01)
(Continued)

(52) U.S. Cl.
CPC .............. *C23C 16/56* (2013.01); *B05C 11/00* (2013.01); *C23C 16/0227* (2013.01);
(Continued)

(58) Field of Classification Search
USPC ........................................................ 396/611
See application file for complete search history.

(56) References Cited

U.S. PATENT DOCUMENTS 6,454,472 B1    9/2002   Kim et al. .................... 396/611
6,887,332 B1 *  5/2005   Kagan ................... B82Y 10/00
                                                   156/232

(Continued)

FOREIGN PATENT DOCUMENTS

CN    1985357 A       6/2007
JP    03-163819 A     7/1991
(Continued)

OTHER PUBLICATIONS

Notice of Reasons of Refusal dated Apr. 26, 2016 in corresponding Japanese Patent Application No. 2012-159917.
(Continued)

*Primary Examiner* — Rodney Fuller
(74) *Attorney, Agent, or Firm* — Ostrolenk Faber LLP

(57) ABSTRACT

An underlayer is formed to cover the upper surface of a substrate and a guide pattern is formed on the underlayer. A DSA film constituted by two types of polymers is formed in a region on the underlayer where the guide pattern is not formed. Thermal processing is performed while a solvent is supplied to the DSA film on the substrate. Thus, a microphase separation of the DSA film occurs. As a result, patterns made of the one polymer and patterns made of another polymer are formed. Exposure processing and development processing are performed in this order on the DSA film after the microphase separation such that the patterns made of another polymer are removed.

20 Claims, 9 Drawing Sheets

(51) Int. Cl.

| | | |
|---|---|---|
| *B05C 11/00* | (2006.01) | |
| *H01J 37/02* | (2006.01) | |
| *H01L 21/033* | (2006.01) | |
| *H01L 21/67* | (2006.01) | |
| *G03F 7/00* | (2006.01) | |
| *G03F 7/16* | (2006.01) | |
| *G03F 7/30* | (2006.01) | |
| *C23C 16/02* | (2006.01) | |
| *G03F 7/20* | (2006.01) | |
| *G03F 7/32* | (2006.01) | |

(52) U.S. Cl.
CPC ............ *G03F 7/0002* (2013.01); *G03F 7/162* (2013.01); *G03F 7/20* (2013.01); *G03F 7/3021* (2013.01); *G03F 7/32* (2013.01); *H01J 37/02* (2013.01); *H01L 21/0335* (2013.01); *H01L 21/0337* (2013.01); *H01L 21/0338* (2013.01); *H01L 21/6715* (2013.01); *H01L 21/67115* (2013.01); *H01L 21/67126* (2013.01); *H01L 21/67178* (2013.01)

(56) References Cited

U.S. PATENT DOCUMENTS

| | | | | |
|---|---|---|---|---|
| 7,491,286 B2* | 2/2009 | Kagan | ............... | B82Y 10/00 156/230 |
| 7,763,319 B2 | 7/2010 | Cheng | ............... | 156/246 |
| 8,641,914 B2* | 2/2014 | Regner | ............... | B05D 1/34 216/17 |
| 8,642,157 B2* | 2/2014 | Millward | ............... | B81C 1/00031 428/105 |
| 9,096,730 B2 | 8/2015 | Millward | | |
| 9,152,054 B2 | 10/2015 | Nishimura | | |
| 9,257,256 B2* | 2/2016 | Millward | ............... | B81C 1/00031 |
| 9,375,748 B2* | 6/2016 | Harumoto | ............... | B05C 11/00 |
| 2003/0213431 A1 | 11/2003 | Fukutomi et al. | ............... | 118/696 |
| 2006/0163582 A1 | 7/2006 | Lee | ............... | 257/66 |
| 2007/0205181 A1 | 9/2007 | Asou et al. | ............... | 216/83 |
| 2007/0275178 A1 | 11/2007 | Nishi et al. | ............... | 427/430.1 |
| 2008/0038467 A1 | 2/2008 | Jagannathan | ............... | 427/256 |
| 2008/0176767 A1 | 7/2008 | Millward | ............... | 506/20 |
| 2008/0193658 A1 | 8/2008 | Millward | ............... | 427/401 |
| 2008/0217292 A1 | 9/2008 | Millward | ............... | 216/46 |
| 2008/0290067 A1 | 11/2008 | Yoshida et al. | ............... | 216/49 |
| 2008/0311347 A1 | 12/2008 | Millward | ............... | 428/144 |
| 2008/0315270 A1* | 12/2008 | Marsh | ............... | B32B 25/00 257/292 |
| 2008/0318005 A1* | 12/2008 | Millward | ............... | B81C 1/00031 428/172 |
| 2009/0200646 A1 | 8/2009 | Millward | ............... | 257/632 |
| 2009/0233236 A1 | 9/2009 | Black | ............... | 430/311 |
| 2009/0236309 A1 | 9/2009 | Millward | ............... | 216/39 |
| 2009/0240001 A1 | 9/2009 | Regner | ............... | 525/95 |
| 2010/0323096 A1 | 12/2010 | Sills | ............... | 427/58 |
| 2011/0065052 A1 | 3/2011 | Inatomi | ............... | 430/325 |
| 2011/0240596 A1 | 10/2011 | Millward | ............... | 216/41 |
| 2012/0138571 A1 | 6/2012 | Black et al. | ............... | 216/41 |
| 2012/0164346 A1 | 6/2012 | Yoneda et al. | ............... | 427/553 |
| 2012/0183736 A1 | 7/2012 | Black et al. | ............... | 428/156 |
| 2012/0183742 A1 | 7/2012 | Black et al. | ............... | 428/172 |
| 2012/0223053 A1 | 9/2012 | Millward et al. | ............... | 216/55 |
| 2012/0263915 A1 | 10/2012 | Millward | ............... | 428/120 |
| 2012/0285929 A1* | 11/2012 | Matsumura | ............... | B44C 1/22 216/49 |
| 2013/0133825 A1* | 5/2013 | Hattori | ............... | B81C 1/00031 156/272.2 |
| 2013/0258299 A1 | 10/2013 | Nishimura | ............... | 355/27 |
| 2013/0270226 A1 | 10/2013 | Millward | ............... | 216/49 |
| 2013/0284698 A1 | 10/2013 | Ogihara | ............... | 216/48 |
| 2013/0287955 A1 | 10/2013 | Portet | ............... | 427/318 |
| 2014/0107296 A1 | 4/2014 | Millward et al. | ............... | 525/280 |
| 2014/0322922 A1 | 10/2014 | Ahmad | ............... | 438/781 |
| 2014/0378592 A1 | 12/2014 | Trefonas, III | ............... | 524/317 |
| 2016/0218032 A1 | 7/2016 | Millward et al. | ............... | 438/666 |

FOREIGN PATENT DOCUMENTS

| | | |
|---|---|---|
| JP | 05-072747 A | 3/1993 |
| JP | 2001-176792 A | 6/2001 |
| JP | 2003-324139 | 11/2003 |
| JP | 2007-235027 | 9/2007 |
| JP | 2007-313568 A | 12/2007 |
| JP | 2010-074185 A | 4/2010 |
| JP | 2010-522643 A | 7/2010 |
| JP | 2010-186929 | 8/2010 |
| JP | 2011-061142 | 3/2011 |
| JP | 2011-515537 A | 5/2011 |
| JP | 2012-134353 A | 7/2012 |
| TW | 200844038 A | 11/2008 |
| TW | 200952072 A1 | 12/2009 |

OTHER PUBLICATIONS

Office Action dated May 18, 2015 in corresponding Taiwanese patent application No. 102125620.
Office Action dated Jan. 12, 2016 in corresponding Taiwanese patent application No. 102125620.
Office Action dated Nov. 22, 2016 in the corresponding Japanese Patent Application No. 2012-159917.
Office Action dated May 9, 2017 in counterpart Taiwanese Patent Application No. 105136951.

* cited by examiner

SUBSTRATE PROCESSING APPARATUS AND SUBSTRATE PROCESSING METHOD

CROSS-REFERENCE TO RELATED APPLICATIONS

This application is a continuation of U.S. patent application Ser. No. 13/943,198, filed Jul. 16, 2013, which claims the benefit of Japanese Patent Application No. 2012-159917, filed Jul. 18, 2012, both incorporated herein by reference.

BACKGROUND OF THE INVENTION (1) Field of the Invention

The present invention relates to a substrate processing apparatus and a substrate processing method for performing processing on a substrate.

(2) Description of Related Art

Substrate processing apparatuses are used to subject various substrates such as semiconductor substrates, substrates for liquid crystal displays, plasma displays, optical disks, magnetic disks, magneto-optical disks, photomasks, and other substrates to various types of processing.

In a substrate processing apparatus described in JP 2003-324139 A, an anti-reflection film and a resist film are formed in this order on a substrate. After exposure processing is performed on the resist film on the substrate in a separate exposure device, development processing is performed in the substrate processing apparatus on the substrate after the exposure processing. Thus, a resist pattern is formed on the substrate.

BRIEF SUMMARY OF THE INVENTION

In order to realize an even finer pattern on the substrate, DSA (Directed Self Assembly) technique using a microphase separation of a block copolymer has been suggested. Various types of materials are considered as the block copolymer used for formation of the pattern. However, it is difficult to appropriately cause the microphase separation in some types of the block copolymer.

An object of the present invention is to provide a substrate processing apparatus and a substrate processing method that can appropriately cause a microphase separation of various types of directed self assembly materials.

(1) According to one aspect of the present invention, a substrate processing apparatus includes a processing film formation unit configured to form a processing film made of a directed self assembly material on a substrate, and a thermal processing unit configured to perform thermal processing while supplying a solvent to the processing film formed on the substrate by the processing film formation unit.

In this substrate processing apparatus, the processing film made of the directed self assembly material is formed on the substrate in the processing film formation unit. Thereafter, the thermal processing is performed in the thermal processing unit while the solvent is supplied to the processing film on the substrate. In this case, the solvent is supplied during the thermal processing for the processing film such that the processing film can be swollen and the microphase separation of the directed self assembly material can be promoted. Thus, in a case where the various types of directed self assembly materials are used, the microphase separation can be appropriately caused. As a result, a fine pattern can be accurately formed on the substrate.

(2) The thermal processing unit may include a thermal processing plate on which the substrate with the processing film formed thereon is placed, the thermal processing plate being configured to adjust a temperature of the placed substrate, a cover configured to surround a space above the thermal processing plate and a solvent supplier configured to supply an evaporated solvent into the cover.

In this case, in a state where the substrate with the processing film formed thereon is placed on the thermal processing plate, a temperature of the substrate is adjusted by the thermal processing plate while the evaporated solvent is supplied into the cover. Thus, the thermal processing can be efficiently performed while the solvent is supplied to the processing film on the substrate with a simple configuration.

(3) The solvent supplier may be configured to supply one or plurality of toluene, heptane, acetone, propylene glycol monomethylether acetate, propylene glycol monomethylether, cyclohexanone, carbon disulfide, tetrahydrofuran as the solvent.

In this case, the microphase separation can be appropriately caused in the case where the various types of directed self assembly are used.

(4) The solvent supplier may be configured to be capable of selectively supplying one of a plurality of types of solvents.

In this case, one of the plurality of types of solvents can be selectively supplied to the processing film on the substrate depending on the type of the directed self assembly material used for the processing film, a shape of the pattern to be formed or the like. Thus, the microphase separation of the directed self assembly material can be more appropriately caused.

(5) The solvent supplier may be configured to be capable of mixing and supplying a plurality of types of solvents.

In this case, the plurality of types of solvents can be mixed and supplied to the processing film on the substrate depending on the type of the directed self assembly material used for the processing film, the shape of the pattern to be formed or the like. Thus, the microphase separation of the directed self assembly material can be more appropriately caused.

(6) The thermal processing unit may further include a decompressor that reduces pressure in the cover. In this case, an amount of the solvent to be used can be reduced. Further, concentration of the solvent in the cover can be kept uniform, so that the solvent can be uniformly supplied to the entire surface of the processing film on the substrate.

(7) The substrate processing apparatus may further include an exposure processing unit configured to perform exposure processing on the processing film after the thermal processing by the thermal processing unit, and a first development processing unit configured to perform development processing by supplying a development liquid to the processing film after the exposure processing by the exposure processing unit.

In this case, the exposure processing is performed on the processing film in the exposure processing unit such that a coupling of different types of polymers is cut in the processing film after the microphase separation. Then, the development liquid is supplied to the processing liquid in the first development processing unit such that an unnecessary polymer is removed. Thus, a desired pattern is formed on the substrate.

(8) The substrate processing apparatus may further include a second development processing unit configured to perform development processing by dry-etching on the processing film after the thermal processing by the thermal processing unit.

In this case, the unnecessary polymer is removed by dry-etching from the processing film after the microphase separation. Thus, the desired pattern is formed on the substrate.

(9) According to another aspect of the present invention, a substrate processing method includes the steps of forming a processing film made of a directed self assembly material on a substrate in a processing film formation unit, and performing thermal processing while supplying a solvent in a thermal processing unit to the processing film formed on the substrate by the processing film formation unit.

This substrate processing method allows the processing film made of the directed self assembly material to be formed on the substrate in the processing film formation unit. Thereafter, the thermal processing is performed in the thermal processing unit while the solvent is supplied to the processing film on the substrate. In this case, the solvent is supplied during the thermal processing for the processing film such that the processing film can be swollen and the microphase separation of the directed self assembly material can be promoted. Thus, in the case where the various types of directed self assembly materials are used, the microphase separation can be appropriately caused. As a result, the fine pattern can be accurately formed on the substrate.

(10) The step of performing the thermal processing may include the step of supplying one or plurality of toluene, heptane, acetone, propylene glycol monomethylether acetate, propylene glycol monomethylether, cyclohexanone, carbon disulfide, tetrahydrofuran as the solvent to the processing film formed on the substrate.

In this case, in the case where the various types of directed self assembly materials are used, the microphase separation can be appropriately caused.

(11) The step of performing the thermal processing may include the step of selectively supplying one of a plurality of types of solvents to the processing film formed on the substrate.

In this case, one of the plurality of types of solvents can be selectively supplied to the processing film on the substrate depending on the type of the directed self assembly material used for the processing film. Thus, the microphase separation of the directed self assembly material can be more appropriately caused.

(12) The step of performing the thermal processing may include the step of mixing and supplying a plurality of types of solvents to the processing film formed on the substrate.

In this case, the plurality of types of solvents can be mixed and supplied to the processing film on the substrate depending on the type of the directed self assembly material used for the processing film. Thus, the microphase separation of the directed self assembly material can be more appropriately caused.

(13) The substrate processing method may further include the steps of performing exposure processing in an exposure processing unit on the processing film after the thermal processing by the thermal processing unit, and performing development processing in a first development processing unit by supplying a development liquid to the processing film after the exposure processing by the exposure processing unit.

In this case, the exposure processing is performed on the processing film in the exposure processing unit such that the coupling of the different types of polymers is cut in the processing film after the microphase separation. Then, the development liquid is supplied to the processing liquid in the first development processing unit such that the unnecessary polymer is removed. Thus, the desired pattern is formed on the substrate.

(14) The substrate processing method may further include the step of performing development processing by dry-etching in a second development processing unit on the processing film after the thermal processing by the thermal processing unit.

In this case, the unnecessary polymer is removed by dry-etching from the processing film after the microphase separation. Thus, the desired pattern is formed on the substrate.

The present invention enables the microphase separation to be appropriately caused in the case where the various types of directed self assembly materials are used.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate processing apparatus, a substrate processing method according to embodiments of the present invention will be described below with reference to the drawings. In the following description, a substrate refers to a semiconductor substrate, a substrate for a liquid crystal display, a substrate for a plasma display, a glass substrate for a photomask, a substrate for an optical disc, a substrate for a magnetic disc, a substrate for a magneto-optical disc, a substrate for a photomask or the like.

(1) Configuration of the Substrate Processing Apparatus

Figure 1:
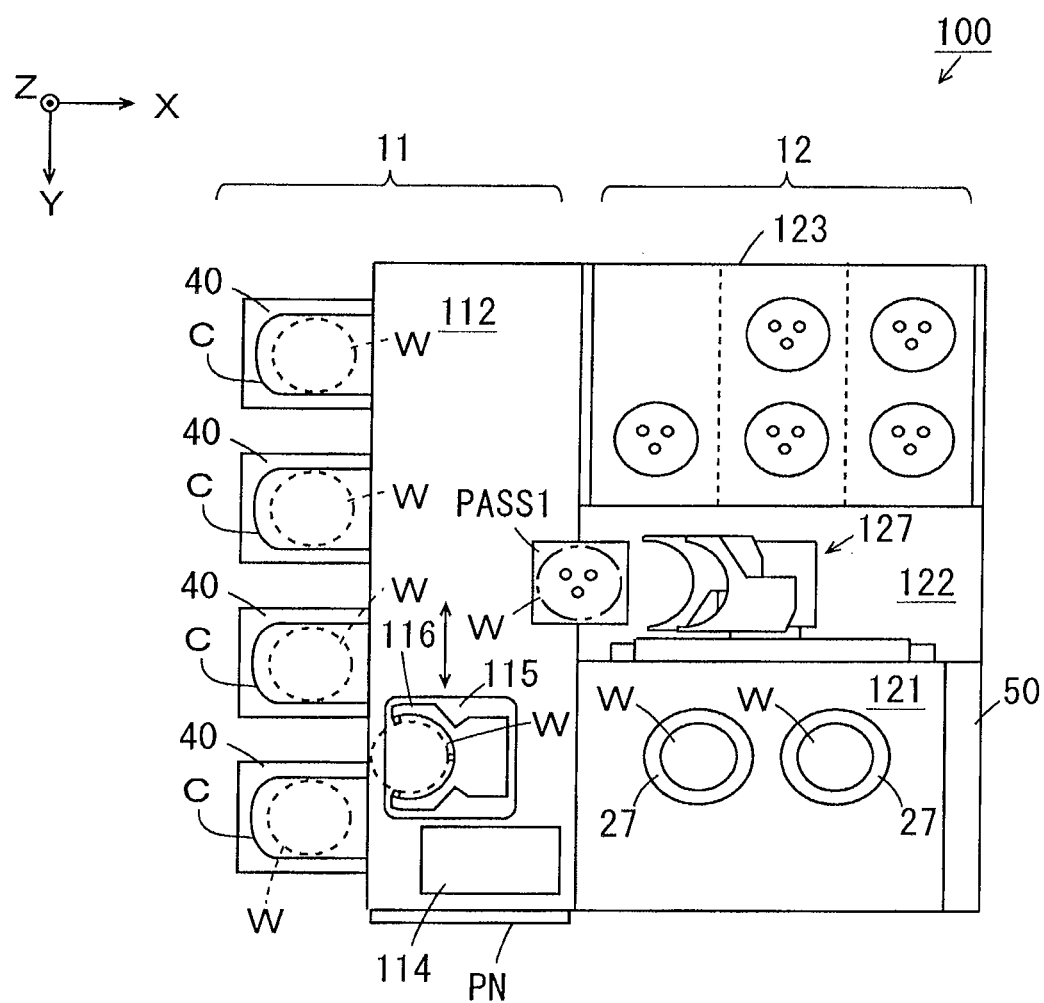
FIG. 1 is a schematic plan view of a substrate processing apparatus according to one embodiment of the present invention.
Figure 2:
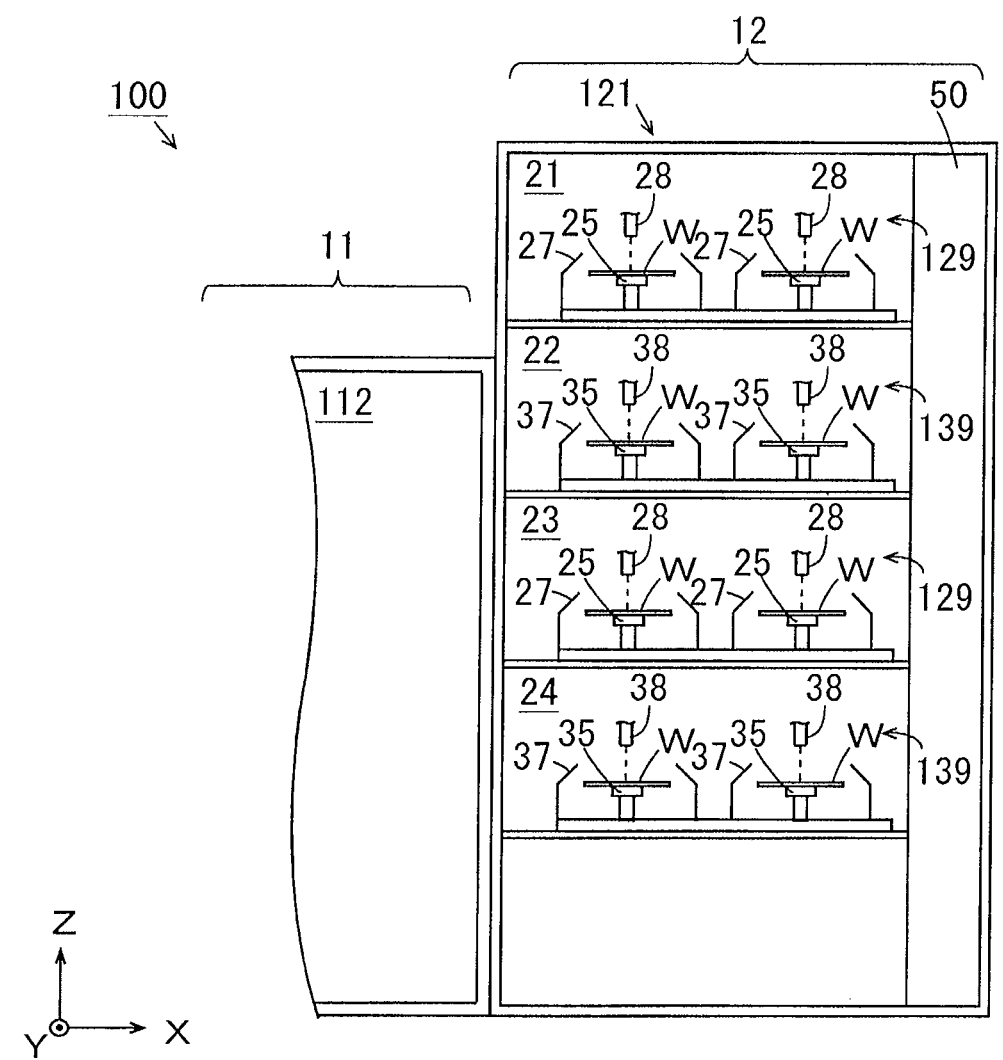
FIG. 2 is a schematic side view of a coating/development processing section of FIG. 1.

FIG. 1 is a schematic plan view of the substrate processing apparatus according to an embodiment of the present invention. FIGS. 1, 2 and subsequent given drawings are accompanied by the arrows that indicate X, Y, and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11 and a processing block 12.

The indexer block 11 includes a plurality of carrier platforms 40 and a transport section 112. A carrier C that stores a plurality of substrates W in multiple stages is placed in each carrier platform 40. In the present embodiment, a FOUP (Front Opening Unified Pod) is used as the carrier C.

Figure 4:
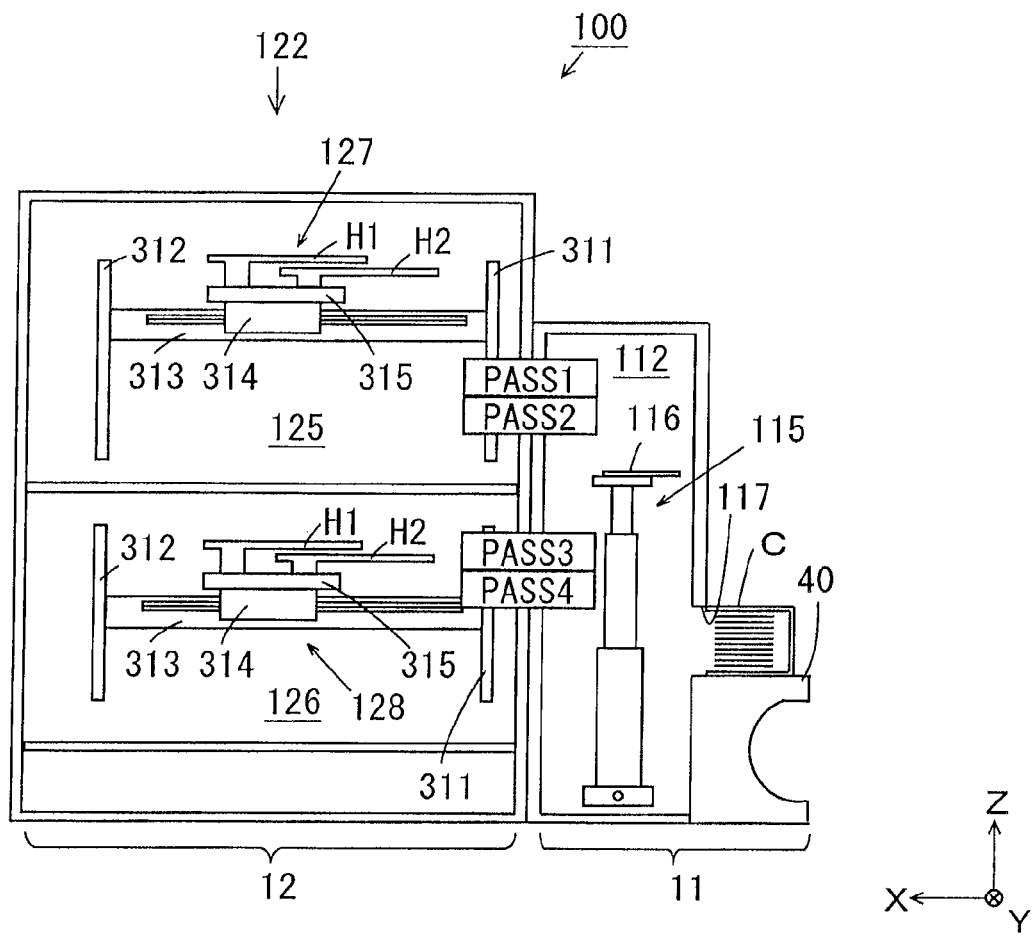
FIG. 4 is a schematic side view of a transport section.

A controller 114 and a transport mechanism 115 are provided in the transport section 112. The controller 114 controls various constituent elements of the substrate processing apparatus 100. The transport mechanism 115 has a hand 116 for holding the substrate W. The transport mechanism 115 transports the substrate W while holding the substrate W with the hand 116. As shown in FIG. 4 described below, an opening 117 for receiving and transferring the substrates W between the carrier C and the transport mechanism 115 is formed in the transport section 112.

A main panel PN is provided on a side surface of the transport section 112. A user can confirm a processing status of the substrate Win the substrate processing apparatus 100 using the main panel PN. An operation unit (not shown) including a keyboard, for example, is provided in the vicinity of the main panel PN. The user can perform operation setting and the like of the substrate processing apparatus 100 by operating the operation unit.

The processing block 12 includes a coating/development processing section 121, a transport section 122 and a thermal processing section 123. The coating/development processing section 121 and the thermal processing section 123 are provided to be opposite to each other with the transport section 122 sandwiched therebetween. A substrate platform PASS1 and substrate platforms PASS2 to PASS4 (FIG. 4), described below, on which the substrates W are to be placed, are provided between the transport section 122 and the indexer block 11. A transport mechanism 127 and a transport mechanism 128 (FIG. 4) described below that transport the substrates W are provided in the transport section 122.

(2) Configuration of the Coating/Development Processing Section

FIG. 2 is a schematic side view of the coating/development processing section 121 of FIG. 1. As shown in FIG. 2, development processing chambers 21, 23 and coating processing chambers 22, 24 are provided in a stack in the coating/development processing section 121. Each of the development processing chambers 21, 23 are provided with a development processing unit 129. Each of the coating processing chambers 22, 24 are provided with a coating processing unit 139.

Each development processing unit 129 includes spin chucks 25 that hold the substrates W and cups 27 provided to cover the surroundings of the spin chucks 25. In the present embodiment, each development processing unit 129 is provided with two pairs of the two spin chucks 25 and the two cups 27. Each spin chuck 25 is driven to be rotated by a driving device (an electric motor, for example) that is not shown. Each development processing unit 129 includes a nozzle 28 for supplying a development liquid on the substrate W held by each spin chuck 25. While the plurality of nozzles 28 may be provided to respectively correspond to the plurality of spin chucks 25 in this example, the common nozzle 28 may be used for the plurality of spin chucks 25.

Each coating processing unit 139 includes spin chucks 35 that hold the substrates W and cups 37 provided to cover the surroundings of the spin chucks 35. In the present embodiment, each coating processing unit 139 is provided with two pairs of the two spin chucks 35 and the two cups 37. Each spin chuck 35 is driven to be rotated by a driving device (an electric motor, for example) that is not shown. Further, each coating processing unit 139 includes a nozzle 38 for supplying a processing liquid on the substrate W held by each spin chuck 35. While the plurality of nozzles 38 are provided to respectively correspond to the plurality of spin chucks 35 in this example, the common nozzle 38 may be used for the plurality of spin chucks 35.

In each coating processing unit 139 in each coating processing chambers 22, 24, the processing liquid made of a directed self assembly material (hereinafter referred to as a DSA material) used for DSA (Directed Self Assembly) technique is applied to the substrate W. Thus, a film made of the DSA material (hereinafter referred to as a DSA film) is formed on the substrate W. The DSA material is made of a block copolymer constituted by a plurality of types of polymers. The plurality of types of polymers that constitute the block copolymer are preferably incompatible with each other.

In the present embodiment, the DSA material constituted by the two types of polymers is used. Combination of the two types of polymers includes polystyrene-polymethylmethacrylate (PS-PMMA), polystyrene-polydimethylsiloxane (PS-PDMS), polyethylene-polyferrocenyl dimethylsilane (PS-PFS), polystyrene-polyethylene oxide (PS-PEO), polystyrene-polyvinylpyridine (PS-PVP), polyethylene-polyhydroxystyrene (PS-PHOST), polymethyl methacrylate-polymethacrylate containing polyhedral oligomeric silsesquioxane (PMMA-PMAPOSS) and the like.

In each development processing unit 129 in each development chambers 21, 23, development processing is performed on the substrate W on which the DSA film is formed. Specifically, the development liquid is supplied to the substrate W on which the DSA film is formed such that unnecessary part of the DSA film is removed. As the development liquid, toluene, heptane, acetone, propylene glycol monomethylether acetate (PGMEA), propylene glycol monomethylether (PGME), cyclohexanone, acetic acid, tetrahydrofuran and the like are used. Details of the development processing will be described below.

As shown in FIGS. 1 and 2, a fluid box 50 is provided at one end of the coating/development processing section 121. Fluid-related elements such as a conduit, a coupler, a valve, a flow meter, a regulator, a pump, and a temperature regulator relating to supply of the processing liquid and the development liquid to the development processing unit 129 and the coating processing unit 139 and drainage of a fluid and exhaust of air from the development processing unit 129 and the coating processing unit 139 are stored in the fluid box 50.

(3) Configuration of the Thermal Processing Section

Figure 3:
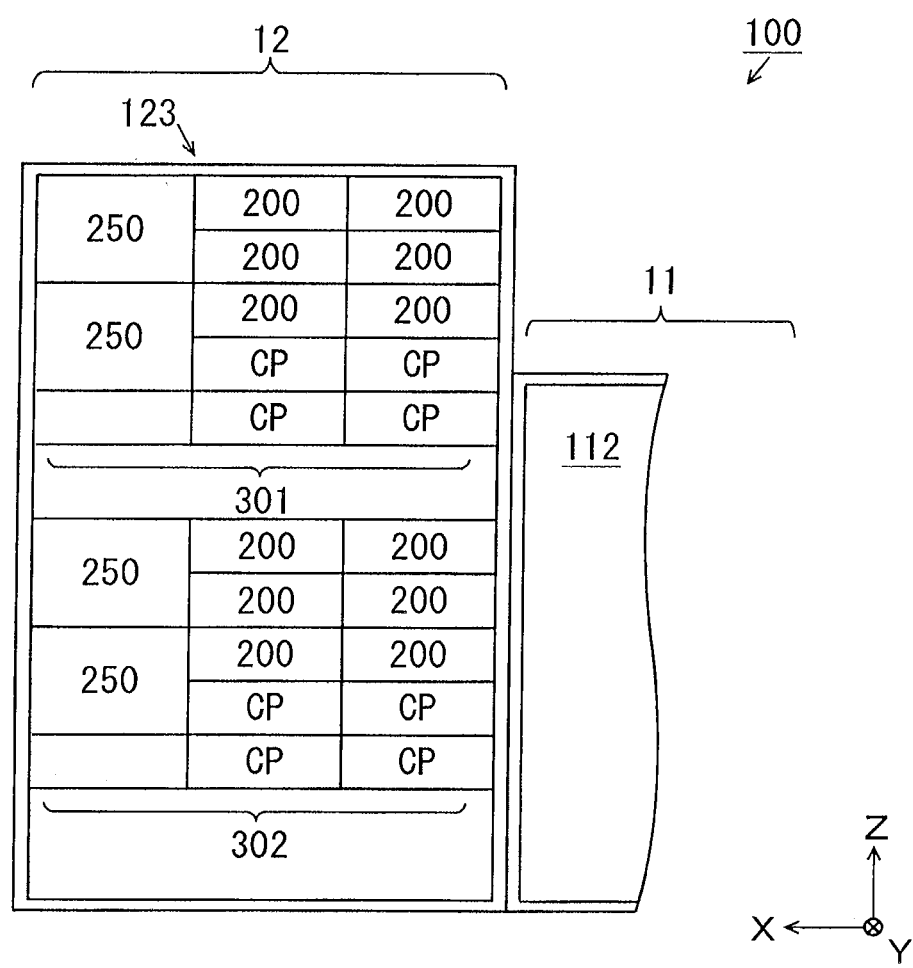
FIG. 3 is a schematic side view of a thermal processing section of FIG. 1.

FIG. 3 is a schematic side view of the thermal processing section 123 of FIG. 1. As shown in FIG. 3, the thermal processing section 123 has an upper thermal processing section 301 provided above and a lower thermal processing section 302 provided below. Each of the upper thermal processing section 301 and the lower thermal processing section 302 is provided with a plurality of thermal processing units 200, a plurality of exposure processing units 250 and a plurality of cooling units CP.

In each thermal processing unit 200, thermal processing using a solvent (hereinafter referred to as solvent thermal processing) is performed on the substrate W after DSA film formation. In each exposure processing unit 250, exposure processing is performed on the substrate W after the solvent thermal processing. Details of the thermal processing unit 200 and the exposure processing unit 250 will be described below. In each cooling unit CP, cooling processing is performed on the substrate W before the DSA film formation and after the solvent thermal processing.

(4) Configuration of the Transport Section

FIG. 4 is a schematic side view of the transport sections 112, 122. As shown in FIG. 4, the transport section 122 has an upper transport chamber 125 and a lower transport chamber 126. The upper transport chamber 125 is provided with the transport mechanism 127, and the lower transport chamber 126 is provided with the transport mechanism 128.

The substrate platforms PASS1, PASS2 are provided between the transport section 112 and the upper transport chamber 125, and the substrate platforms PASS3, PASS4 are provided between the transport section 112 and the lower transport chamber 126.

The substrate W transported from the indexer block 11 to the processing block 12 is placed on the substrate platform PASS1, PASS3. The substrate W transported from the processing block 12 to the indexer block 11 is placed on the substrate platform PASS2, PASS4.

Each of the transport mechanisms 127, 128 includes guide rails 311, 312, 313, a moving member 314, a rotation member 315 and hands H1, H2. The guide rails 311, 312 are respectively provided to extend in the vertical direction. Each guide rail 313 is provided to extend in a horizontal direction (X direction) between each guide rail 311 and each guide rail 312 and attached to the guide rails 311, 312 to be movable in the vertical direction. Each moving member 314 is attached to each guide rail 313 to be movable in the horizontal direction (X direction).

Each rotation member 315 is provided on the upper surface of the moving member 314 to be rotatable. Each of the hands H1, H2 for holding the substrate W is attached to the rotation member 315. The hands H1, H2 are configured to be movable back and forth with the rotation member 315 as a basis.

Such configuration enables each of the transport mechanisms 127, 128 to hold the substrate W using the hands H1, H2 and to transport the substrate W by moving in the X and Z directions. The transport mechanism 127 transports the substrate W among the substrate platforms PASS1, PASS2, the development processing chamber 21 (FIG. 2), the coating processing chamber 22 (FIG. 2) and the upper thermal processing section 301 (FIG. 3). The transport mechanism 128 transports the substrate W among the substrate platforms PASS3, PASS4, the development processing chamber 23 (FIG. 2), the coating processing chamber 24 (FIG. 2) and the lower thermal processing section 302 (FIG. 3).

(5) Processing for the Substrate

A summary of the processing for the substrate W in the substrate processing apparatus 100 will be described.

(5-1) First Example of the Processing

FIGS. 5A to 5D are schematic cross sectional views for explaining the first example of the processing of the substrate W in the substrate processing apparatus 100.

Figure 5A:
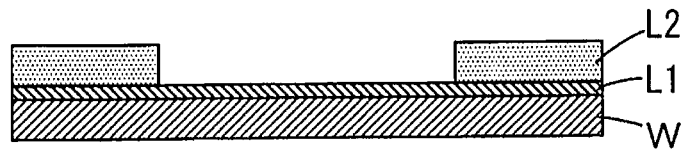
FIGS. 5A to 5D are schematic cross sectional views for explaining a first example of processing for a substrate in the substrate processing apparatus.

In the first example of the processing, as shown in FIG. 5A, an underlayer L1 is formed to cover the upper surface of the substrate W and a guide pattern L2 made of a photoresist, for example, is formed on the underlayer L1 as an initial state before the substrate W is carried into the substrate processing apparatus 100.

Figure 5B:
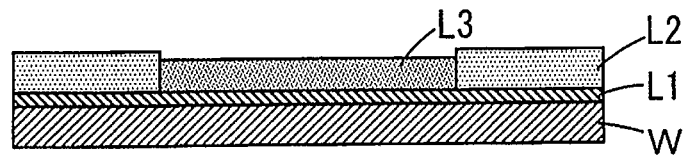
Figure 5C:
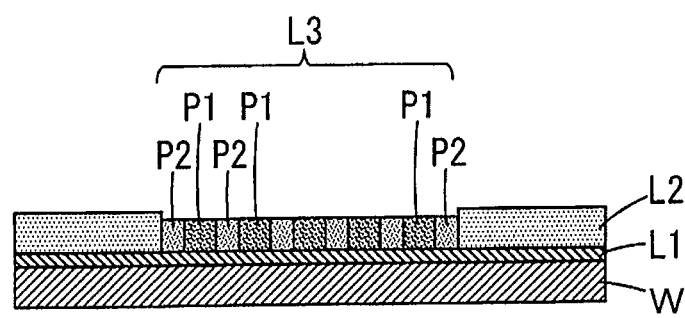

In the substrate processing apparatus 100, as shown in FIG. 5B, a DSA film L3 constituted by the two types of polymers is formed in a region on the underlayer L1 where the guide pattern L2 is not formed. Next, the solvent thermal processing is performed on the DSA film L3 on the substrate W such that a microphase separation of the DSA film L3 occurs. As a result, as shown in FIG. 5C, patterns P1 made of the one polymer and patterns P2 made of the other polymer are formed. In this example, the line patterns P1 and the line patterns P2 are alternately formed along the guide pattern L2.

Figure 5D:
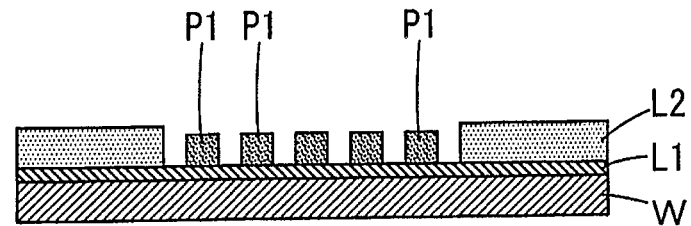

Next, the exposure processing is performed on the entire surface of the DSA film L3 after the microphase separation such that a coupling of the one polymer and the other polymer is cut and the patterns P1 and the patterns P2 are separated. Then, the development processing is performed on the DSA film L3 on the substrate W such that the patterns P2 are removed as shown in FIG. 5D. Finally, the patterns P1 remain on the substrate W.

(5-2) Second Example of the Processing

FIGS. 6A to 6D are schematic cross sectional views for explaining the second example of the processing for the substrate W in the substrate processing apparatus 100.

Figure 6A:
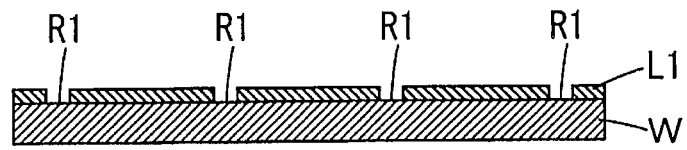
FIGS. 6A to 6D are schematic cross sectional views for explaining a second example of processing for the substrate in the substrate processing apparatus.

In the second example of the processing, as shown in FIG. 6A, the underlayer L1 is formed on the upper surface of the substrate W such that a plurality of line regions R1 are exposed at intervals as an initial state before the substrate W is carried into the substrate processing apparatus 100.

Figure 6B:
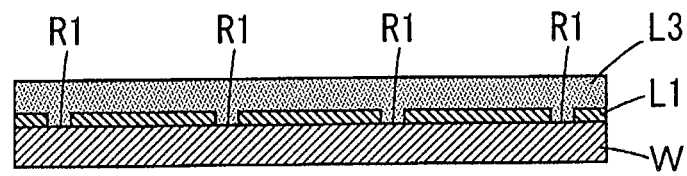
Figure 6C:
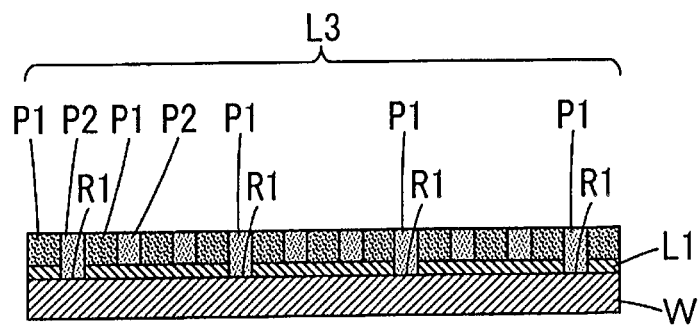

In the substrate processing apparatus 100, as shown in FIG. 6B, the DSA film L3 constituted by the two types of polymers is formed to cover the regions R1 and the underlayer L1. Next, the solvent thermal processing is performed on the DSA film L3 on the substrate W such that the microphase separation of the DSA film L3 occurs. As a result, as shown in FIG. 6C, the patterns P1 made of the one polymer and the patterns P2 made of the other polymer are formed. In this example, the line pattern P2 is formed on each region R1, and the line patterns P1 and the line patterns P2 are alternately formed on the underlayer L1 along the patterns P2.

Figure 6D:
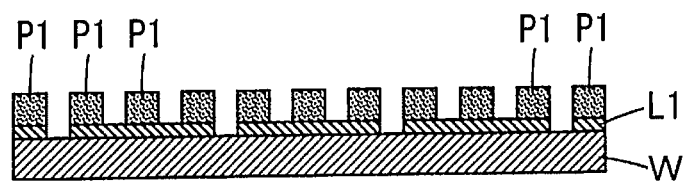

Thereafter, similarly to the example of FIGS. 5A to 5D, the exposure processing is performed on the entire surface of the DSA film L3 after the microphase separation and the development processing is performed on the DSA film L3 after the exposure processing, whereby the patterns P2 are removed as shown in FIG. 6D. Finally, the patterns P1 remain on the substrate W.

(6) Operation

The operation of the substrate processing apparatus 100 will be described. First, the carrier C in which the substrates W in the initial state (see FIG. 5A and FIG. 6A) are stored is placed on the carrier platform 40 in the indexer block 11 (FIG. 1). The transport mechanism 115 alternately transports the substrates W in the initial state from the carrier C to the substrate platform PASS1 and the substrate platform PASS3 (FIG. 4).

The substrate W placed on the substrate platform PASS1 is taken out by the hand H1 of the transport mechanism 127 (FIG. 4). Next, the transport mechanism 127 (FIG. 4) takes out the substrate W after the cooling processing from one cooling unit CP in the upper thermal processing section 301 (FIG. 3) using the hand H2 and carries the substrate W held by the hand H1 into the cooling unit CP. In this case, a temperature of the substrate W is adjusted to a temperature suitable for formation of the DSA film L3 in the cooling unit CP.

Then, the transport mechanism 127 (FIG. 4) takes out the substrate W after the formation of the DSA film L3 (FIG. 5B and FIG. 6B) placed on the spin chuck 35 in the coating processing chamber 22 (FIG. 2) using the hand H1 and places the substrate W after the cooling processing held by the hand H2 on the spin chuck 35. The DSA film L3 is formed on the substrate W by the coating processing unit 139 (FIG. 2) in the coating processing chamber 22 (see FIG. 5B and FIG. 6B).

Next, the transport mechanism 127 (FIG. 4) takes out the substrate W after the solvent thermal processing (see FIG. 5C and FIG. 6C) from one thermal processing unit 200 in the upper thermal processing section 301 (FIG. 3) using the hand H2, and carries the substrate W after the formation of the DSA film L3 held by the hand H1 into the thermal processing unit 200. The solvent thermal processing for the substrate W is performed in the thermal processing unit 200 (See FIG. 5C and FIG. 6C).

Then, the transport mechanism 127 (FIG. 4) takes out the substrate W after the cooling processing from one cooling unit CP in the upper thermal processing section 301 (FIG. 3) using the hand H1, and carries the substrate W after the solvent thermal processing held by the hand H2 into the cooling unit CP. In this case, in the cooling unit CP, a temperature of the substrate W is adjusted to a temperature suitable for the exposure processing.

Next, the transport mechanism 127 (FIG. 4) takes out the substrate W after the exposure processing from one exposure processing unit 250 in the upper thermal processing section 301 (FIG. 3) using the hand H2, and carries the substrate W after the cooling processing held by the hand H1 into the exposure processing unit 250. In the exposure processing unit 250, the exposure processing is performed on the substrate W after the solvent thermal processing.

Then, the transport mechanism 127 (FIG. 4) takes out the substrate W after the development processing (see FIG. 5D and FIG. 6D) placed on the spin chuck 25 in the development processing chamber 21 (FIG. 2) using the hand H1 and places the substrate W after the exposure processing held 2 5 by the hand H2 on the spin chuck 35. The development processing is performed on the substrate W, after the exposure processing, by the development processing unit 129 in the development processing chamber 21 (see FIG. 5D and FIG. 6D). Thereafter, the transport mechanism 127 places the substrate W after the development processing held by the hand H1 on the substrate platform PASS2 (FIG. 4).

The transport mechanism 127 repeats the processing described above, whereby the predetermined processing is successively performed on the plurality of substrates W in the processing block 12.

The transport mechanism 128 carries in and carries out the substrate W to/from the substrate platforms PASS3, PASS4, the development processing chamber 23, the coating processing chamber 24 and the lower thermal processing section 302 by the similar operation to the transport mechanism 127. The similar processing to the development processing chamber 21, the coating processing chamber 22 and the upper thermal processing section 301 are performed in the development processing chamber 23, the coating processing chamber 24 and the lower thermal processing section 302.

In such a way, in the present embodiment, the substrate W transported by the transport mechanism 127 is processed in the development processing chamber 21, the coating processing chamber 22 and the upper thermal processing chamber 301, and the substrate W transported by the transport mechanism 128 is processed in the development processing chamber 23, the coating processing chamber 24 and the lower thermal processing section 302. In this case, the processing for the substrates W can be concurrently performed in the upper processing section (the coating processing chambers 21, 22 and the upper thermal processing section 301) and the lower processing section (the coating processing chambers 23, 24 and the lower thermal processing section 302).

(7) Thermal Processing Unit

Figure 7:
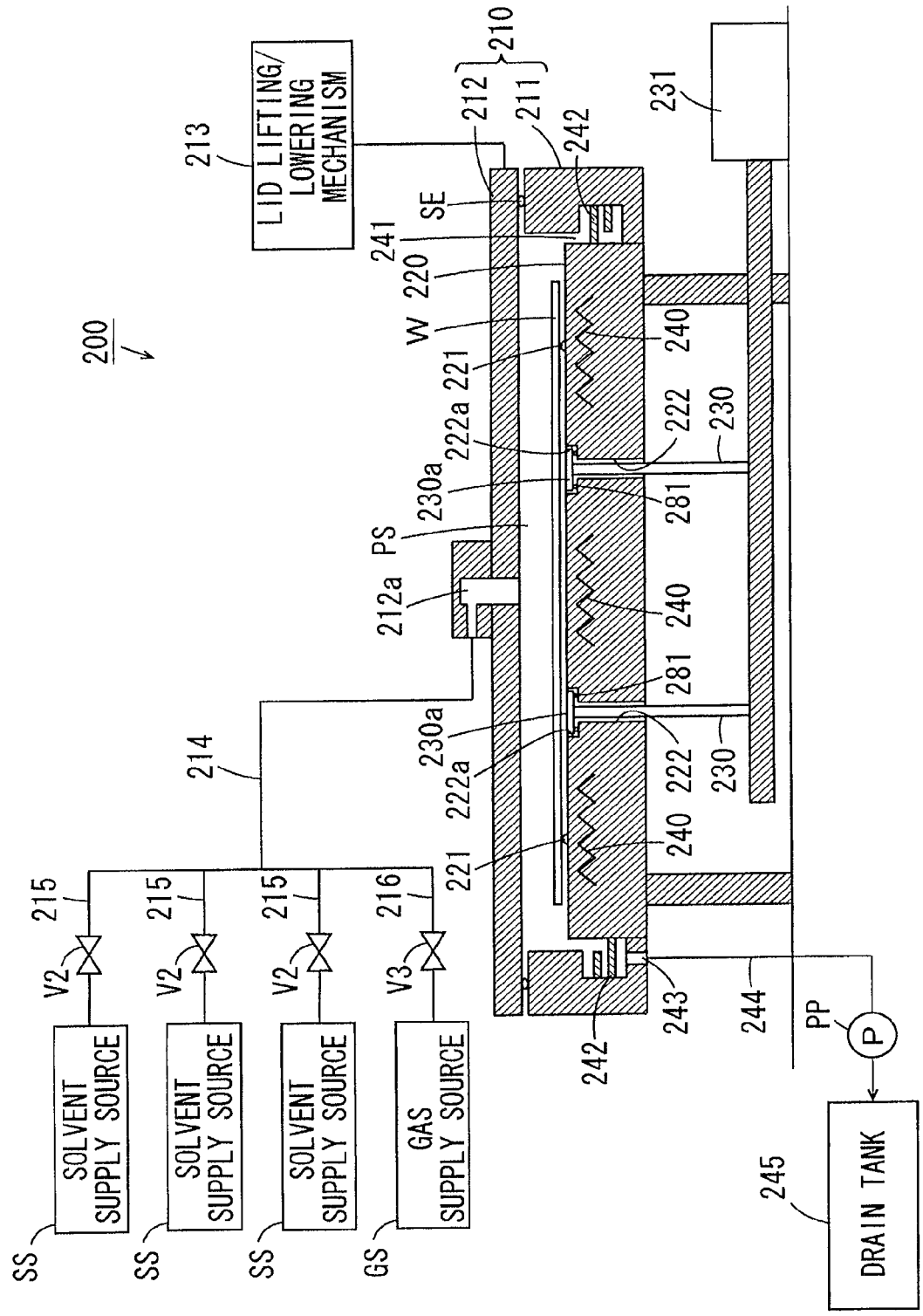
FIG. 7 is a schematic cross sectional view showing the configuration of a thermal processing unit.

FIG. 7 is a schematic cross sectional view showing the configuration of the thermal processing unit 200. As shown in FIG. 7, the thermal processing unit 200 includes a chamber 210 constituted by a peripheral wall 211 and a lid 212. A plate 220 for placing the substrate W is provided inside the peripheral wall 211.

A seal member SE is attached to the upper end surface of the peripheral wall 211. The seal member SE is made of an O-ring, for example. The lid 212 is connected to a lid lifting/lowering mechanism 213. The lid 212 is lifted and lowered between an upper position and a lower position by the lid lifting/lowering mechanism 213. When the lid 212 is arranged at the upper position, an upper opening of the peripheral wall 211 is opened. When the lid 212 is arranged at the lower position, the upper opening of the peripheral wall 211 is closed. In this case, the lower surface of the lid 212 adheres to the seal member SE and an air-tight processing space PS is formed inside the chamber 210.

A plurality of (three, for example) proximity balls 221 are provided on the upper surface of the plate 220. The substrate W is placed on the plurality of proximity balls 221 to be spaced apart from the upper surface of the plate 220 only for a predetermined distance (0.1 mm, for example). A plurality of (three, for example) through holes 222 are provided to penetrate the plate 220 in the vertical direction. A plurality of (three, for example) support pins 230 are inserted into the plurality of through holes 222, respectively. A disk-shaped sealing portion 230a is provided at the tip end of each support pin 230. In the plate 220, a plurality of recesses 222a that can store the plurality of sealing portions 230a are provided at the upper ends of the plurality of through holes 222. A seal member 281 is attached on the bottom surface of each recess 222a to surround the upper opening of each through hole 222. The sealing member 281 is made of the O-ring, for example.

The plurality of support pins 230 are connected to a support pin lifting/lowering mechanism 231 arranged below the plate 220. The support pin lifting/lowering mechanism 231 is constituted by an air cylinder, for example. The plurality of support pins 230 are integrally lifted and lowered between an upper position and a lower position by the support pin lifting/lowering mechanism 231. When the support pins 230 are arranged at the upper position, the substrate W is supported on the sealing portions 230a of the support pins 230. When the support pins 230 are arranged at the lower position, the lower surfaces of the sealing portions 230a of the support pins 230 adheres to the sealing members 281. Thus, the upper ends of the through holes 222 are sealed in an airtight state.

Temperature regulators 240 are provided in the plate 220. Each temperature regulator 240 is a heater, for example. A temperature of the plate 220 is adjusted by the temperature regulators 240. Thus, the thermal processing for the substrate W placed on the plate 220 is performed.

An exhaust groove 241 is formed at the peripheral wall 211 of the chamber 210 to surround the plate 220. A plurality of labyrinth rings 242 are provided at the exhaust groove 241. The plurality of labyrinth rings 242 are configured such that pressure in the exhaust groove 241 (exhaust pressure) is substantially uniform. An exhaust hole 243 is formed at the peripheral wall 211 to communicate with the lower end of the exhaust groove 241. The exhaust hole 243 is connected to a drain tank 245 through a collection line 244. A pump PP is inserted into the collection line 244. The pump PP operates such that an atmosphere and a solvent in the processing space PS is led to the drain tank 245 through the collection line 244. Thus, the pressure in the processing space PS is reduced.

An introduction hole 212a for introducing the solvent into the processing space PS is formed at the lid 212 of the chamber 210. One end of the introduction hole 212a is positioned at the substantially center of the lower surface of the lid 212. One end of a supply pipe 214 is connected to the other end of the introduction hole 212a. The other end of the supply pipe 214 is branched into a plurality of (three in this example) supply pipes 215 and one supply pipe 216. The plurality of supply pipes 215 are connected to a plurality of (three in this example) solvent supply sources SS, respectively. The plurality of solvent supply sources SS supply the solvents that are different types from each other and evaporated. The supply pipe 216 is connected to a gas supply source GS. The gas supply source GS supplies an inert gas such as a nitrogen gas. A valve V2 is inserted into each supply pipe 215. A valve V3 is inserted into the supply pipe 216.

The plurality of valves V2 respectively correspond to the plurality of solvent supply sources SS. The one or plurality of valves V2 of the plurality of valves V2 is selectively opened, whereby the evaporated solvent is introduced from the corresponding solvent supply source SS to the valve V2 into the processing space PS through the supply pipes 215, 214 and the introduction hole 212a of the lid 212. Thus, the one type of the solvent selected from the plurality of types of solvents can be supplied to the substrate W. Further, not less than two types of solvents selected out of the plurality of types of solvents can be mixed and supplied to the substrate W.

The solvent supplied to the substrate W is preferably a good solvent with respect to the DSA film L3 (FIG. 5C and FIG. 6C). For example, toluene, heptane, acetone, propylene glycol monomethylether acetate (PGMEA), propylene glycol monomethylether (PGME), cyclohexanone, carbon disulfide, tetrahydrofuran or the like is used. In this case, when the various types of DSA materials are used, the microphase separation can be appropriately caused.

The valve V3 is opened such that the inert gas is introduced from the gas supply source GS to the processing space PS through the supply pipes 216, 214 and the introduction hole 212a of the lid 212. The one or plurality of valves V2 of the plurality of valves V2 is opened and the valve V3 is opened such that the selected one or plurality of solvents and the inert gas are mixed, to be introduced into the processing space PS. Thus, concentration (mixture ratio) of the solvent supplied to the substrate W can be adjusted. Further, all the valves V2 are closed and the valve V3 is opened such that only the inert gas can be introduced into the processing space PS.

The solvent thermal processing in the thermal processing unit 200 will be described. The operation of each constituent element of the thermal processing unit 200 is controlled by the controller 114 of FIG. 1.

First, the lid 212 is arranged at the upper position by the lid lifting/lowering mechanism 213, and the plurality of support pins 230 are arranged at the upper position by the support pin lifting/lowering mechanism 231. In this state, the substrate W is placed on the plurality of support pins 230 by the transport mechanism 127 or the transport mechanism 128. This substrate W has the DSA film L3 (FIGS. 5A to 6D) formed by the coating processing unit 139 (FIG. 2).

Then, the plurality of support pins 230 are lowered to the lower position by the support pin lifting/lowering mechanism 231. This causes the substrate W to be placed on the plate 220 (on the proximity balls 221). Further, the lid 212 is lowered to the lower position by the lid lifting/lowering mechanism 213.

In this state, a temperature of the plate 220 is adjusted by the temperature regulators 240 and the thermal processing for the substrate W is performed. In this case, the temperature of the substrate W is not higher than a pyrolysis (thermal decomposition) temperature of a polymer chain that constitutes the DSA material, and adjusted in a range from not less than a room temperature to not more than 250° C., for example. Further, at least the one valve V2 of the plurality of valves V2 and the valve 3 is opened. Thus, the evaporated solvent is introduced from the corresponding solvent supply source SS into the processing space PS through the supply pipes 215, 214 and the introduction hole 212a of the lid 212. In this case, the one or plurality of types of solvents of the plurality of types of solvents is selectively supplied to the substrate W depending on the type of the DSA material used for the DSA film L3, the shape of the pattern to be formed or the like.

Further, the pump PP is driven such that the processing space PS is evacuated and its pressure is reduced. Thus, a flow of the solvent from the introduction hole 212a of the lid 212 toward the exhaust groove 241 is formed and the solvent is supplied to the entire DSA film L3 on the substrate W. In such a way, the solvent thermal processing is performed on the DSA film L3 on the substrate W.

In the present embodiment, as described above, the one or plurality of types of solvents of the plurality of types of solvents is selectively supplied to the substrate W depending on the type of the DSA material used for the DSA film L3, the shape of the pattern to be formed or the like. Thus, the microphase separation of the DSA material can be appropriately caused. Further, the solvent is supplied to the DSA film L3 on the substrate W while the pressure in the processing space PS is reduced. Thus, an amount of the solvent to be used can be reduced. Further, concentration of the solvent in the processing space PS can be kept uniform, so that the solvent can be uniformly supplied to the entire surface of the DSA film L3 on the substrate W. Further, the solvent can be reliably prevented from leaking to the outside of the chamber 210.

After a predetermined time period is elapsed, all the valves V2 are closed and the valve V3 is opened. Thus, the solvent in the processing space PS is replaced with the inert gas. Next, the operation of the pump PP is stopped and the pressure in the processing space PS returns to a normal pressure. Next, the valve V3 is closed and the lid 212 is lifted to the upper position by the lid lifting/lowering mechanism 213. Further, the plurality of support pins 230 are lifted to the upper position by the support pin lifting/lowering mechanism 231, whereby the substrate W is spaced apart from the plate 220. Thereafter, the substrate W on the plurality of support pins 230 is received by the transport mechanism 127 or the transport mechanism 128 and carried out from the thermal processing unit 200.

(8) Exposure Processing Unit

Figure 8:
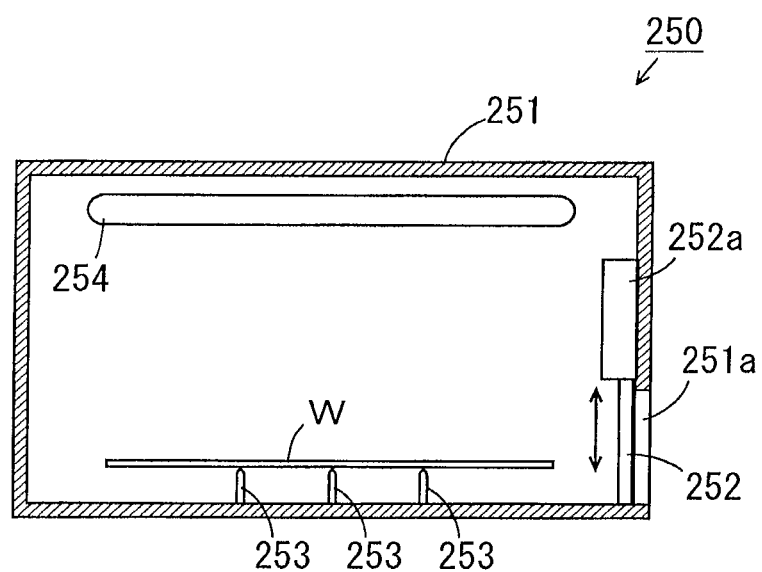
FIG. 8 is a schematic cross sectional view showing the configuration of an exposure processing unit.

FIG. 8 is a schematic cross sectional view showing the configuration of the exposure processing unit 250. As shown in FIG. 8, the exposure processing unit 250 includes a casing 251. A carry-in/carry-out port 251a for carrying in and carrying out the substrate W is provided on the side of the casing 251. A shutter 252 is provided inside of the carry-in/carry-out port 251a. The shutter 252 is lifted and lowered by a shutter driving device 252a. The carry-in/carry-out port 251a is closed or opened by the shutter 252.

A plurality of support pins 253 are provided on the bottom surface of the casing 251. The substrate W is placed on the plurality of support pins 253. A plurality of light emitters 254 are arranged at an upper portion in the casing 251. The plurality of light emitters 254 are provided to respectively extend in one direction and arranged to be parallel with each other. Only the one light emitter 254 is shown in FIG. 8.

The operation of the exposure processing unit 250 will be described. The operation of each constituent element of the exposure processing unit 250 is controlled by the controller 114 of FIG. 1.

First, the shutter 252 is lifted by the shutter driving device 252*a*, and the carry-in/carry-out port 251*a* is opened. In this state, the substrate W is placed on the support pins 253 by the transport mechanism 127 or the transport mechanism 128. This substrate W has the phase-separating DSA film L3 after the solvent thermal processing by the thermal processing unit 200 (FIG. 7) and the cooling processing by the cooling unit CP.

Next, the shutter 252 is lowered by the shutter driving mechanism 252*a* and the carry-in/carry-out port 251*a* is closed. Then, an inert gas (a nitrogen gas or an argon gas, for example) is introduced into the casing 251 from a gas supply port (not shown). Thus, concentration of oxygen in the casing 251 is adjusted and maintained. In this state, the entire DSA film L3 on the substrate W placed on the support pins 253 is irradiated with light by the plurality of light emitters 254. Thus, the exposure processing is performed on the DSA film L3 on the substrate W.

After a predetermined time period is elapsed, an irradiation of light by the plurality of the light emitters 254 is stopped. Next, the shutter 252 is lifted by the shutter lifting/lowering device 252*a*, and the carry-in/carry-out port 251*a* is opened. Thereafter, the substrate W on the support pins 253 is received by the transport mechanism 127 or the transport mechanism 128 and is carried out from the exposure processing unit 250.

(9) Another Example of the Exposure Processing Unit

Figure 9:
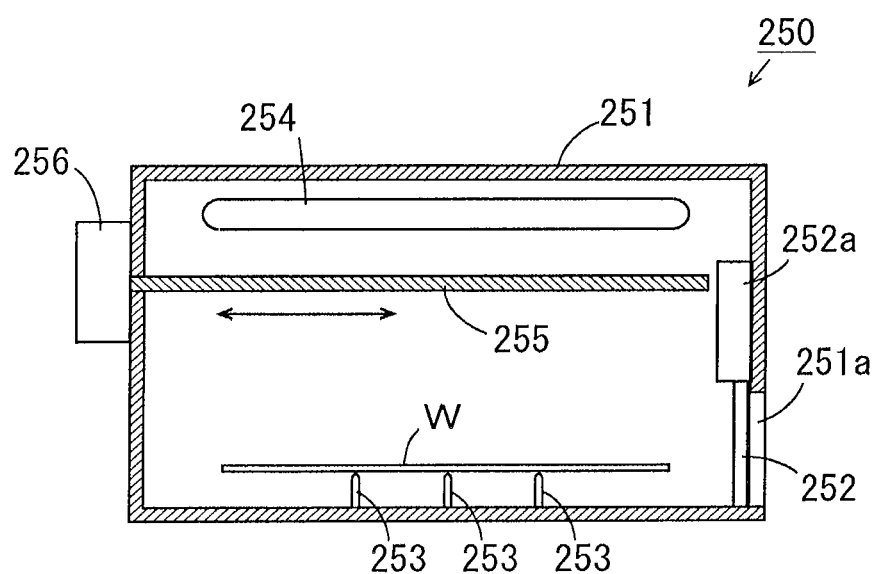
FIG. 9 is a schematic cross sectional view showing another example of the exposure processing unit.

FIG. 9 is a schematic cross sectional view showing another example of the exposure processing unit 250. As for the exposure processing unit 250 of FIG. 9, difference from the example of FIG. 8 will be described.

The exposure processing unit 250 of FIG. 9 further includes a shutter 255 and a shutter driving device 256. The shutter 255 is provided in a substantially horizontal attitude at a position lower than the plurality of light emitters 254. The shutter 255 is moved in the horizontal direction by the shutter driving device 256.

In this example, the plurality of light emitters 254 continuously emit light. The shutter 255 is moved in the horizontal direction while the substrate W is placed on the support pins 253, whereby a state of the exposure processing unit 250 is switched to a state where the light from the light emitters 254 is shielded by the shutter 255 or a state where the substrate W is irradiated with the light from the light emitters 254. Thus, a time period of the exposure processing for the DSA film L3 on the substrate W is adjusted.

While the substrate W is placed on the plurality of support pins 253 in the examples of FIGS. 8 and 9, a cooling plate may be provided in the exposure processing unit 250 and the substrate W may be placed on the cooling plate.

(10) Effects

In the substrate processing apparatus 100 according to the present embodiment, the thermal processing is performed while the solvent is supplied to the DSA film L3 on the substrate W by the thermal processing unit 200 after the DSA film L3 is formed on the substrate W by the coating processing unit 139. In this case, the DSA film L3 can be swollen by the solvent, so that the microphase separation of the DSA material can be promoted. Thus, in the case where the various types of DSA materials are used, the microphase separation can be appropriately caused. As a result, a fine pattern can be accurately formed on the substrate W.

(11) Other Embodiments (11-1)

While the development processing unit 129 is configured to perform the development processing by supplying the development liquid to the DSA film L3 on the substrate W in the embodiment described above, the invention is not limited to this. The development processing unit 129 may be configured to perform the development processing by performing dry-etching such as plasma etching on the DSA film L3 on the substrate W.

Specifically, the dry-etching is performed on the DSA film L3 after the microphase separation in the development processing unit 129 such that the unnecessary polymers (pattern P2 of FIGS. 5C and 6C) are removed from the DSA film L3. In this case, the development processing can be performed without performing the exposure processing on the DSA film L3 after the microphase separation. Thus, a number of processing steps is reduced and throughput is improved. Further, because the exposure processing unit 250 does not have to be provided, a size of the substrate processing apparatus 100 can be reduced.

(11-2)

While the substrate processing apparatus 100 includes the exposure processing unit 250 and the development processing unit 129 in the embodiment described above, at least one of the exposure processing unit 250 and the development processing unit 129 may be provided as an external device of the substrate processing device 100.

(11-3)

While the one or plurality of types of solvents of the plurality of types of solvents is selectively supplied to the DSA film L3 on the substrate W in the thermal processing unit 200, only the one predetermined type of solvent may be used if the microphase separation of the DSA film L3 can be appropriately caused.

(12) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the embodiment described above, the substrate processing apparatus 100 is an example of a substrate processing apparatus, the coating processing unit 139 is an example of a processing film formation unit, the thermal processing unit 200 is an example of a thermal processing unit, the plate 220 is an example of a thermal processing plate, the chamber 210 is an example of a cover, the introduction hole 212*a* is an example of a solvent supplier, the pump PP is an example of a decompressor, the exposure processing unit 250 is an example of an exposure processing unit and the development processing unit 129 is an example of first and second development processing units.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A substrate processing method, comprising the steps of:
supplying a coating liquid that includes a directed self assembly material constituted by two types of polymers onto a substrate to form a film made of the directed self assembly material on the substrate by a coater;
supplying an evaporated solvent to the substrate with the film formed thereon by a solvent supplier;
performing thermal processing on the substrate with the film formed thereon by a heater; and
irradiating the film on the substrate after the supply of the solvent and after the thermal processing with light by a light emitter,
wherein the step of irradiating the film includes irradiating the substrate stored in a casing with light.

2. The substrate processing method according to claim 1, wherein the step of irradiating the film includes switching a light irradiation state.

3. The substrate processing method according to claim 1, wherein the step of performing the thermal processing includes causing microphase separation in the film to form a first pattern made of one of the two types of polymers and a second pattern made of the other polymer.

4. The substrate processing method according to claim 3, wherein the step of irradiating the flim includes cutting a coupling of the one polymer and the other polymer to separate the first pattern and the second pattern.

5. The substrate processing method according to claim 3, wherein the step of supplying the solvent includes swelling the film to promote the microphase separation.

6. The substrate processing method according to claim 1, wherein the solvent includes one or plurality of toluene, heptane, acetone, propylene glycol monomethylether acetate, propylene glycol monomethylether, cyclohexanone, carbon disulfide and tetrahydrofuran.

7. The substrate processing method according to claim 1, wherein the two types of polymers include any of a combination of polystyrene and polymethylmethacrylate, a combination of polystyrene and polydimethylsiloxane, a combination of polyethylene and polyferrocenyl dimethylsilane, a combination of polystyrene and polyethylene oxide, a combination of polystyrene and polyvinylpyridine, a combination of polyethylene and polyhydroxystyrene, and a combination of polymethyl methacrylate and polymethacrylate containing polyhedral oligomeric silsesquioxane.

8. The substrate processing method according to claim 7, wherein the two types of polymers are incompatible with each other.

9. The substrate processing method according to claim 1, wherein the step of performing the thermal processing includes thermally processing the substrate at a temperature in a range from not lower than room temperature to not higher than thermal decomposition temperature of a polymer chain constituting the directed self assembly material.

10. The substrate processing method according to claim 1, further comprising the step of performing cooling processing on the substrate before the step of forming the film, and the step of performing cooling processing on the substrate after the step of performing the thermal processing by the heater and before the step of irradiating the film.

11. The substrate processing method according to claim 1, wherein the step of performing the thermal processing by the heater includes forming a first pattern made of one of the two types of polymers and a second pattern made of the other polymer by the thermal processing,
the substrate processing method further comprising the step of removing the second pattern from the substrate by performing development processing on the film after the step of irradiating the film.

12. The substrate processing method according to claim 11, wherein the step of removing the second pattern includes performing the development processing by supplying to the substrate at least one of toluene, heptane, acetone, propylene glycol monomethylether acetate, propylene glycol monomethylether, cyclohexanone, acetic acid and tetrahydrofuran as a development liquid.

13. The substrate processing method according to claim 11, wherein the step of removing the second pattern includes performing the development processing by dry etching.

14. A substrate processing method comprising the steps of:
supplying a coating liquid that includes a directed self assembly material constituted by two types of polymers onto a substrate to form a film made of the directed self assembly material on the substrate by a coater;
supplying an evaporated solvent to the substrate with the film formed thereon by a solvent supplier;
performing thermal processing on the substrate with the film formed thereon by a heater; and
irradiating the film on the substrate after the supply of the solvent and after the thermal processing with light by a light emitter,
wherein the step of performing the thermal processing includes causing microphase separation in the film to form a first pattern made of one of the two types of polymers and a second pattern made of the other polymer, and
the step of irradiating the film includes cutting a coupling of the one polymer and the other polymer to separate the first pattern and the second pattern.

15. The substrate processing method according to claim 14, wherein the step of irradiating the film includes switching a light irradiation state.

16. The substrate processing method according to claim 14, further comprising the step of performing cooling processing on the substrate before the step of forming the film, and the step of performing cooling processing on the substrate after the step of performing the thermal processing by the heater and before the step of irradiating the film.

17. The substrate processing method according to claim 14, wherein the step of performing the thermal processing by the heater includes forming the first pattern made of the one of the two types of polymers and the second pattern made of the other polymer by the thermal processing,
the substrate processing method further comprising the step of removing the second pattern from the substrate by performing development processing on the film after the step of irradiating the film.

18. A substrate processing method, comprising the steps of:
supplying a coating liquid that includes a directed self assembly material constituted by two types of polymers onto a substrate to form a film made of the directed self assembly material on the substrate by a coater;
supplying an evaporated solvent to the substrate with the film formed thereon by a solvent supplier;
performing thermal processing on the substrate with the film formed thereon by a heater; and
irradiating the film on the substrate after the supply of the solvent and after the thermal processing with light by a light emitter,
wherein the step of irradiating the film includes switching a light irradiation state.

19. The substrate processing method according to claim 18, further comprising the step of performing cooling processing on the substrate before the step of forming the film, and the step of performing cooling processing on the substrate after the step of performing the thermal processing by the heater and before the step of irradiating the film.

20. The substrate processing method according to claim 18, wherein the step of performing the thermal processing by the heater includes forming a first pattern made of one of the two types of polymers and a second pattern made of the other polymer by the thermal processing, the substrate processing method further comprising the step of removing the second pattern from the substrate by performing development processing on the film after the step of irradiating the film.

* * * * *